United States Patent
Ritzen et al.

(10) Patent No.: US 7,196,767 B2
(45) Date of Patent: Mar. 27, 2007

(54) APPARATUS WITH COMPARTMENT FOR HIGH VACUUM AND USE OF CONSTRUCTION ELEMENT FOR CONSTRUCTING A COMPARTMENT FOR HIGH VACUUM

(75) Inventors: Raymond Johannes Elisabeth Ritzen, Eindhoven (NL); Hans Jansen, Eindhoven (NL); Hugo Petiers, Veldhoven (NL); John Bernardus Henricus Cornelius Martinus Harbers, Deurne (NL)

(73) Assignee: ASML Netherlands B.V., Veldhoven (NL)

( * ) Notice: Subject to any disclaimer, the term of this patent is extended or adjusted under 35 U.S.C. 154(b) by 181 days.

(21) Appl. No.: 10/941,018

(22) Filed: Sep. 15, 2004

(65) Prior Publication Data

US 2006/0055901 A1    Mar. 16, 2006

(51) Int. Cl.
G03B 27/52    (2006.01)
G03B 27/42    (2006.01)
G03G 15/00    (2006.01)

(52) U.S. Cl. .......................... 355/30; 355/53; 355/133

(58) Field of Classification Search .................. 355/30, 355/53, 133; 411/443
See application file for complete search history.

(56) References Cited

U.S. PATENT DOCUMENTS

| | | | | |
|---|---|---|---|---|
| 3,894,570 A | * | 7/1975 | Reynolds ..................... 411/333 |
| 6,333,775 B1 | * | 12/2001 | Haney et al. ................. 355/30 |
| 6,613,452 B2 | * | 9/2003 | Weir .......................... 428/652 |
| 2004/0265092 A1 | * | 12/2004 | Lat et al. ..................... 411/443 |
| 2006/0046080 A1 | * | 3/2006 | Keener et al. .............. 428/457 |

* cited by examiner

Primary Examiner—Henry Hung Nguyen
(74) Attorney, Agent, or Firm—Pillsbury Winthrop Shaw Pittman LLP

(57) ABSTRACT

An apparatus is disclosed. The apparatus includes a compartment for containing a high vacuum environment. The compartment is partly defined by and/or includes a surface that has a subsurface that includes a first zone and a second zone. The second zone is located between the first zone and the surface. The first zone includes a metal or alloy that has a composition which differs from stainless steel. Diffusion is more difficult in the second zone than in the first zone, so that gaseous molecules are inhibited from escaping from the subsurface into the high vacuum environment.

13 Claims, 3 Drawing Sheets

APPARATUS WITH COMPARTMENT FOR HIGH VACUUM AND USE OF CONSTRUCTION ELEMENT FOR CONSTRUCTING A COMPARTMENT FOR HIGH VACUUM

FIELD

The present invention relates to an apparatus that includes at least one compartment in which during the operation of the apparatus, a high vacuum environment is temporarily to be maintained. The present invention further relates to the use of a substantially metal construction element for constructing a compartment in which a high vacuum is temporarily to be maintained and/or for constructing a component that is to be placed in such a compartment. The present invention also relates to a method for enhancing a vacuum compatibility of an iron-based metal or alloy that has a composition that differs from stainless steel.

BACKGROUND

Apparatus that include compartments for High Vacuum (HV) environments are well-known and widely used in, for example, the manufacture of integrated circuits (ICs), where the high vacuum serves to minimize the presence of contaminating particles or species. Due to interaction of these particles or species with, for example, a projection beam in the apparatus, optical components and/or a substrate which is to be manufactured into an IC, these particles may have a detrimental effect on the accuracy of the apparatus.

The term "High Vacuum environment" encompasses a gaseous environment with a pressure of less than 10 hPa. Also, environments usually referred to as Ultra High Vacuum (UHV) or even higher are covered by the term "High Vacuum environment" or "High Vacuum".

A compartment in which at least temporarily a high vacuum is to be maintained is generally constructed from construction elements of stainless steel, or in exceptional cases aluminum. It is common practice to use stainless steel for constructing a compartment for HV, as this is generally believed to provide a low cost material which in use still meets predetermined requirements. One of the main advantages of stainless steel is its high resistance to corrosion. In High Vacuum environments, corrosion is to be avoided as, especially with iron-based materials, corrosion is typically accompanied by the formation of a rough and very porous surface structure ('rust'), which allows for an enormously large surface to which molecules can adsorb. In the porous surface structure, volumes are formed from which it may be difficult or impossible to remove the gasses by pumping within a reasonable time (often called 'virtual leaks' in vacuum technology). Facing a High Vacuum environment, these sticky molecules may at some stage be released by the surface into the space which is meant to be held under vacuum conditions, which counteracts the maintenance of the vacuum. Hence, stainless steel, which has a high resistance to corrosion and thus a high resistance to the formation of the porous surface structures, has proved to be a very useful material for constructing compartments in which a high vacuum is to be maintained. Stainless steel has also proved to be a useful material for at least partly constructing components which are to be placed in such a compartment.

Even though stainless steel is one of the least expensive materials known today that is suitable for constructing High Vacuum compartments, stainless steel still remains a relatively expensive material. The suitability of stainless steel for use in environments which are to be maintained under High Vacuum is in this context referred to as vacuum compatibility of stainless steel.

Although in the remaining part, reference may only be made to constructing compartments in which a high vacuum is to be maintained, it is understood that such reference also applies to constructing components which are to be placed in such a compartment.

SUMMARY

It is an aspect of the invention to provide an apparatus that includes at least one compartment in which high vacuum can be maintained and that is less costly than a compartment constructed using construction elements of stainless steel and/or a compartment including surfaces of, for example, stainless steel and/or aluminum.

It is an aspect of the invention to provide an apparatus that includes a compartment for high vacuum using alloys which may be more suitable to be cast into a predetermined shape than stainless steel.

It is an aspect of the invention to provide an apparatus that includes a compartment for high vacuum constructed from construction elements that may have improved machineability than stainless steel construction elements.

It is an aspect of the invention to provide an apparatus that includes a compartment for high vacuum constructed from construction elements that may be more widely available and therefore less expensive than stainless steel elements.

It is an aspect of the invention to provide an apparatus that includes a compartment for high vacuum that is constructed using steel bolts having an improved vacuum compatibility than bolts used for construction of high vacuum compartments known from the prior art.

According to an aspect of the invention, there is provided an apparatus that includes at least one compartment in which at least during operation of the apparatus, a high vacuum (HV) environment is to be maintained, at least temporarily. The at least one compartment is at least partly defined by and/or includes a surface having a subsurface including a first zone and a second zone. The second zone is located between the first zone and the surface. The first zone includes a metal or alloy having a composition which differs from any composition of stainless steel, and diffusion of gaseous molecules is more difficult in the second zone than in the first zone, so that gaseous molecules are inhibited from escaping from the subsurface into the high vacuum environment.

According to the invention, as at least a part of the subsurface, namely the first zone, is not made of stainless steel and at least one of the surface-related properties of stainless steel is still provided by the presence of a diffusion barrier, a material that is less expensive than stainless steel may be chosen for constructing a compartment for HV without compromising on technical requirements related to vacuum compatibility. In more general terms, the second zone provides the corrosion resistance and the first zone may consequently have an intrinsically much lower resistance to corrosion than the second zone. An advantage of the invention is that the surface-related properties of the metal used for constructing a compartment for HV, do not necessarily prescribe the use of stainless steel, thereby allowing for more freedom in selecting a metal for constructing a compartment for HV and perhaps even for more freedom in design of such a compartment.

In an embodiment of an apparatus according to the invention, the subsurface includes an iron-based metal.

There is a wide range of iron-based metals, each of which having different properties. This allows for choosing an iron-based metal which may meet requirements different from surface-related requirements than stainless steel would have done if stainless steel were to be used. For example, an iron-based metal with more suitable mechanical properties, even more suitable than the mechanical properties of stainless steel, or improved machineability, may be selected for constructing a compartment for HV.

In an embodiment of an apparatus according to the invention, the subsurface includes a carbon steel. This allows for the possibility of forming a second zone by, for example, indiffusion of chromium, as further explained below.

In an embodiment of an apparatus according to the invention, the subsurface includes a low alloy steel. The term "low alloy steel" refers to a carbon steel with a content of chromium that is less than about 12% by weight. Such low alloy steels are typically less expensive than stainless steels.

In an embodiment of an apparatus according to the invention, the second zone includes a higher mass percentage of chromium than the first zone. Chromium is one of the elements that makes a stainless steel resistant to corrosion. By providing chromium only where corrosion needs to be resisted, e.g., at the surface and close to the surface, part of the subsurface that is different from the second zone may be engineered or selected to meet requirements other than the requirements met by the second zone, and/or to be less expensive than the second zone.

In an embodiment of the apparatus according to the invention, the second zone includes a higher mass percentage of carbon than in the first zone. This also means that part of the subsurface that is different from the second zone may be engineered or selected to meet requirements different from surface related requirements and/or to be less expensive than the second zone.

In an embodiment of the apparatus according to the invention, the second zone includes chromium in a mass percentage of about 12% or more. Surprisingly, as established by outgassing tests, this appears to be a composition of the second zone at which hardly any gaseous molecules escape from the subsurface into the high vacuum environment, despite a vacuum incompatibility of the first zone.

In an embodiment of the apparatus according to the invention, the second zone includes chromium in a mass percentage of about 30% or more. In this embodiment, the second zone has a composition at which the outgassing tests show even less outgassing of the subsurface. Furthermore, the resistance to corrosion has been shown to be very good. The resistance to wear also appears to be high.

In an embodiment of an apparatus according to the invention, the surface has a hardness of about 2000 Micro Vickers. This indicates a certain robustness of the material, which may enhance the lifetime of the compartment.

In an embodiment of an apparatus according to the invention, the second zone has a dimension in a range of about 5 micron to about 25 micron in a direction substantially normal to the surface. With such a "depth" of the second zone, many aspects of the invention are achieved, while much of the subsurface has been left for meeting requirements other than surface-related requirements. In other words, the first zone covers the majority of the subsurface.

In an embodiment of an apparatus according to the invention, the subsurface is obtainable by at least diffusion of chromium into the surface of a metal layer. Such a subsurface may be obtained by a relatively simple process, which is well documented. A reference is given in the description further below. It turns out that the above-mentioned resistance to corrosion and resistance to wear may also be achieved using such an indiffusion process. The metal surface resulting form this indiffusion process is a corrosion resistant surface, which stays very smooth, thereby minimizing a surface area onto which molecules may adhere. Another advantage of this process is that the dimensions of an object having a metal surface as described above will not lead to a significant change in dimensions of this metal surface with respect to the situation in which the metal surfaces have not been subjected to indiffusion of chromium. This means that, for example, construction elements may be machined, or fabricated by other means such a casting, so that these construction elements directly obtain their final or nearly final dimensions. After the indiffusion of chromium has taken place, no further intensive processing or machining methods need to be applied to the surface. Some limited machining, such as bending, may still possible, if needed.

In an embodiment of an apparatus according to the invention, the subsurface is obtainable by at least diffusion of carbon into the surface of the metal layer. Carbonating a metal surface is well documented. Carbon has been found to aid the formation of the second zone. Carbonating the surface allows for the use of a subsurface that has a low carbon content before obtaining the second zone. This allows for an even wider choice of materials to be used as the subsurface.

In an embodiment of an apparatus according to the invention, the apparatus includes a lithographic apparatus that includes an illumination system for providing a beam of radiation, and a support structure for supporting the patterning device. The patterning device serves to impart the beam of radiation with a pattern in its cross-section. The apparatus also includes a substrate table for holding a substrate, and a projection system for projecting the patterned beam onto a target portion of the substrate.

This allows for the manufacture of ICs with a less expensive and/or more accurate apparatus than the apparatus of the prior art, as will be described in more detail below.

It is an aspect of the invention to provide the use of a substantially metal construction element, provided with chromium diffused into a subsurface thereof, for constructing a compartment in which at least temporarily a high vacuum (HV) is to be maintained and/or for constructing at least partly a component which is to be placed in such a compartment.

It is an aspect of the invention to provide a method for enhancing a vacuum compatibility of an iron-based metal or alloy having a composition which differs from any composition of stainless steel. The method includes diffusing chromium into a surface of the metal or alloy.

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one, one, or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction), while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate as used herein may also refer to a substrate that already contains multiple processed layers.

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
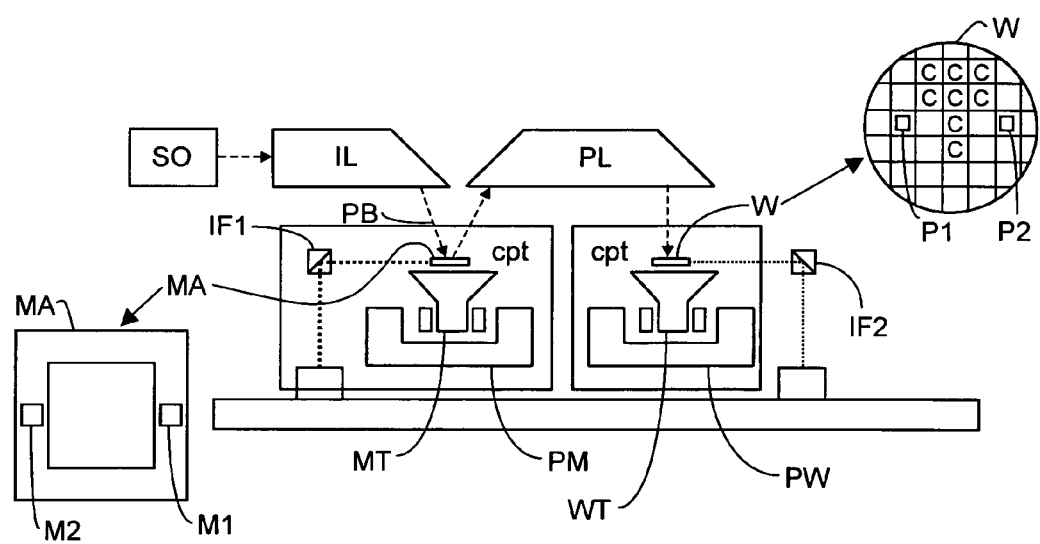
FIG. 1 depicts a lithographic apparatus of a reflective type according to an embodiment of the invention.

FIG. 1 schematically depicts a lithographic apparatus according to an embodiment of the invention. The apparatus includes an illumination system (illuminator) IL for providing a projection beam of radiation PB (e.g. UV or EUV radiation); a first support structure (e.g. a mask table) MT for supporting a patterning device (e.g. a mask) MA and connected to a first positioning device PM for accurately positioning the patterning device MA with respect to item PL; a substrate table (e.g. a wafer table) WT for holding a substrate (e.g. a resist-coated wafer) W and connected to a second positioning device PW for accurately positioning the substrate with respect to item PL; and a projection system (e.g. a reflective projection lens) PL for imaging a pattern imparted to the projection beam PB by the patterning device MA onto a target portion C (e.g. including one or more dies) of the substrate W.

Figure 3:
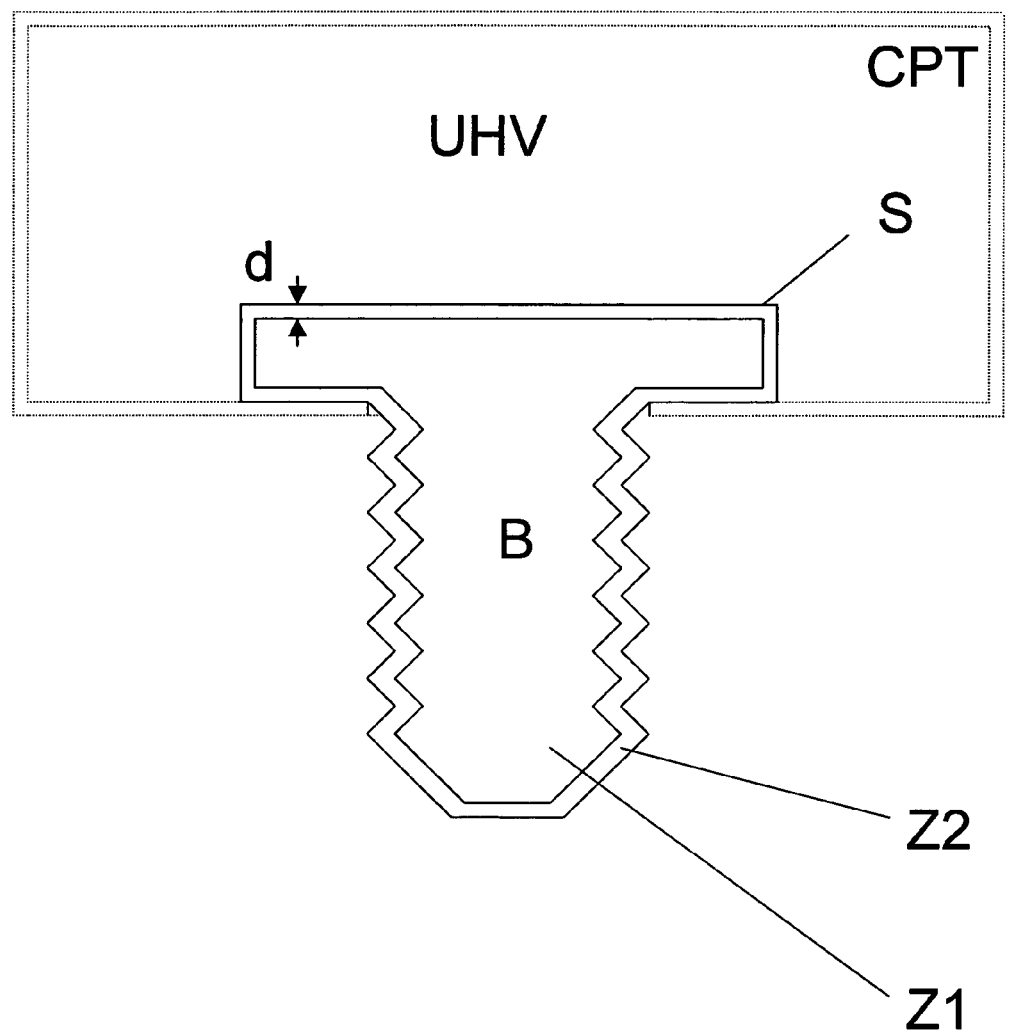
FIG. 3 depicts schematically a part of an apparatus according to an embodiment of the invention.

The apparatus includes one or more compartments CPT in which at least during operation, at least a High Vacuum (HV) or even an Ultra High Vacuum (UHV) is to be maintained, at least temporarily. Such a compartment CPT is at least partly defined by a surface S having a subsurface that includes a first zone Z1 and a second zone Z2. This is schematically shown in FIG. 3. The second zone Z2 is located between the first zone Z1, and the surface S. The first zone Z1 includes a metal or alloy which has a composition different from any composition of stainless steel. Diffusion of gaseous molecules is more difficult in the second zone Z2 than in the first zone Z1 so that gaseous molecules are inhibited from escaping from the subsurface into the compartment CPT. Details of the surfaces of at least a part of such a compartment CPT will be described further below. Such compartments may be found in the apparatus where the projection beam PB crosses a compartment.

As depicted in FIG. 1, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is a plasma discharge source. In such cases, the source is not considered to form part of the lithographic apparatus and the radiation beam is generally passed from the source SO to the illuminator IL with the aid of a radiation collector including, for example, suitable collecting mirrors and/or a spectral purity filter. In other cases, the source may be an integral part of the apparatus, for example when the source is a mercury lamp. The source SO and the illuminator IL, may be referred to as a radiation system.

The illuminator IL may include an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator IL provides a conditioned beam of radiation, referred to as the projection beam PB, having a desired uniformity and intensity distribution in its cross-section.

The projection beam PB is incident on the patterning device MA, which is held on the support structure MT. Being reflected by the patterning device MA, the projection beam PB passes through the lens PL, which focuses the beam PB onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and position sensor IF1 can be used to accurately position the patterning device MA with respect to the path of the beam PB, e.g. after mechanical retrieval from a mask library, or during a scan. In general, movement of the support structure MT and the substrate table WT will be realized with the aid of a long-stroke module (coarse positioning) and a short-stroke module (fine positioning), which form part of the positioning devices PM and PW. However, in the case of a stepper (as opposed to a scanner) the support structure MT may be connected to a short stroke actuator only, or may be fixed. The patterning device MA and the substrate W may be aligned using patterning device alignment marks M1, M2 and substrate alignment marks P1, P2.

For the sake of clarity only a few compartments CPT are shown. However, the apparatus shown in FIG. 1 may include many more compartments as described above. Basically, anywhere in the apparatus where a high vacuum needs to be maintained, the compartment may be defined as described above.

The depicted apparatus could be used in at least one of the following preferred modes:

1. In step mode, the support structure MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the projection beam is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
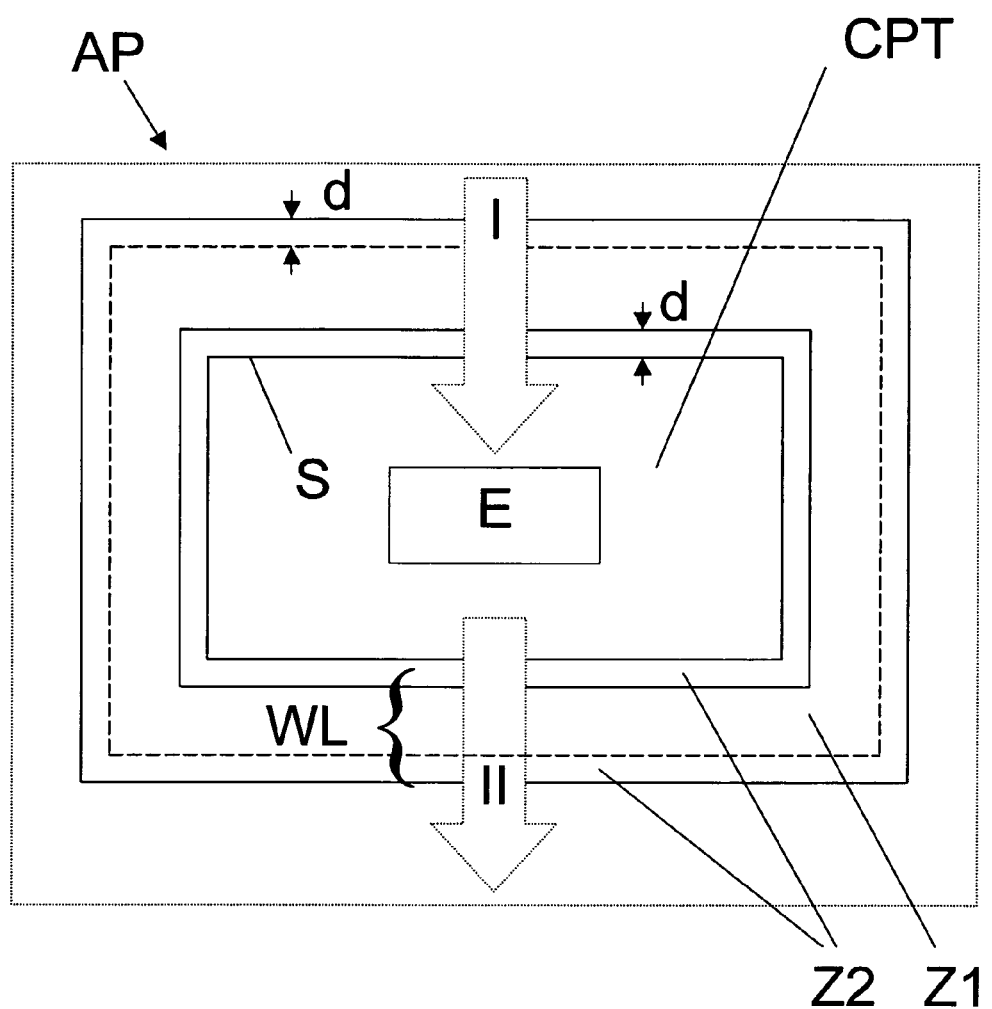
FIG. 2 depicts schematically a part of an apparatus according to an embodiment of the invention.

FIG. 2 shows very schematically a compartment CPT of an apparatus AP according to the invention. This may be a compartment in a lithographic apparatus, as described above. During the operation of the apparatus, at least a High Vacuum (HV) or even an Ultra High Vacuum (UHV) is to be maintained, at least temporarily, in the compartment CPT. In this example, the compartment CPT is defined by a surface S having a subsurface that includes a first zone Z1 and a second zone Z2. The second zone Z2 is located between the first zone Z1 and the surface S. The second zone Z2 extends from the first zone Z1 up to the surface S. The border between the second zone Z2 and the first zone Z1 may not be sharp and may include a transitional zone. The surface S may have a composition which differs from the composition of the second zone Z2 due to surface related phenomena. The first zone Z1 includes a metal or alloy that has a composition that differs from any composition of stainless steel. Diffusion of gaseous molecules in the second zone Z2 is more difficult than in the first zone Z1, such that gaseous molecules are inhibited from escaping from the subsurface into the compartment CPT. Generally, the subsurface includes an iron-based metal. The subsurface may include, for example, a carbon steel. It is, however, possible to use other metals or alloys for the subsurface.

The carbon steel may be a low alloy steel. The second zone Z2 may include a higher percentage of chromium than the percentage of chromium in the first zone Z1. The second zone Z2 may also include a higher percentage of carbon than the percentage of carbon in the first zone Z1. The second zone Z2 may include about 12% (by mass) chromium or more. It is even possible that the second zone Z2 includes about 30% chromium or more. Also, a second zone Z2 having mass percentage of chromium between about 45% and about 55% is possible. The surface S may have a hardness of about 2000 Micro Vickers. The second zone Z2 may have a dimension d in a range of about 5 microns to about 25 microns in a direction that is substantially normal to the surface S. The subsurface as included by the first zone Z1 and the second zone Z2 is obtainable by at least diffusion of chromium into the surface of a metal layer. Such a process is well-known and well-documented. It is described, for example, in an article titled "Inchromeren" by R. C. Jongbloed as published in Dutch magazine "Roestvrij Staal" 2/93 page 37–38. The process entails, for example, embedding the metal surface in powder that includes chromium, followed by heat treating to a temperature at which diffusion of chromium into the metal surface occurs. To prevent oxidation of the powder, the process may be carried out in an inert gas environment. An activator may be used to enable the process to be carried out at lower temperatures.

Also, other processes of indiffusion of chromium may be applicable. A chromium containing powder may be brought into a gaseous state. A chromium containing gas with an origin that is different from the powder may be brought into contact with the respective surface of a metal or alloy. It is also possible to apply a fluid that includes chromium particles to the respective surface.

Without being bound by any theory, it is believed that the chromium diffuses into the metal, thereby forming a layer saturated with chromium. After exposure to oxygen, for example, after the heat treatment, a second zone Z2 that includes chromium oxide is formed. When a carbon steel is used as the metal layer, a second zone Z2 that includes chromium carbide may be formed during the heat treatment. It is possible that ⅔ of the second zone Z2 is formed in the original subsurface while ⅓ of the second zone Z2 is formed on top of the original surface, so that the surface moves outwardly during the process. Also, in this embodiment, the surface S is considered to have a subsurface that includes a second zone Z2 between the surface S and the first zone Z1. The second zone Z2 acts as a seal or so-called diffusion barrier that inhibits diffusion or escaping of gaseous molecules into the environment to which the surface S is exposed. The second zone Z2 also appears to be resistant to corrosion.

It is possible that on either side of the first zone Z1, a second zone Z2 may be formed, depending on which surfaces were subjected to the processes described above. This is schematically shown in FIG. 2.

The compartment CPT may partly be defined by element E, which may be situated for interaction with, for example, a production beam I, as schematically indicated by arrow I. The element E may, for example, be an optical component. The projection beam I may, after interaction with element E, i.e. the optical component, leave the compartment as schematically indicated by arrow II. In FIG. 2, the walls of the compartment CPT are schematically shown to be of a material that has a subsurface that includes a first zone Z1 and a second zone Z2, as described above. However, the compartment may not only include walls of a surface having the described subsurface. For example, a holder (not shown) of the optical component E, may include a surface S as described above, also defining partly the compartment for high vacuum. Any surface which, during operation of the apparatus, is at least temporarily exposed to a high vacuum environment defines, at least partly, a compartment CPT.

The compartment CPT may also be defined by construction elements, such as bolts. High tensile strength bolts as known in the prior art for use in lithographic apparatus are typically provided with a passivated zinc coating to prevent oxidation. Such zinc coated bolts are not suitable for defining a compartment in which a vacuum is to be maintained and in which EUV radiation is to be generated or is propagated. This unsuitability stems from unfavorable outgassing characteristics, and the risk that the zinc may evaporate and deposit on locations within the vacuum equipment, once the equipment is heated. Only low tensile strength bolts (stainless steel bolts) have so far been known to be suitable, which limits construction requirements and design. According to the present invention, normal steel bolts, provided with chromium diffused into a subsurface thereof may be used for constructing a compartment in which an at least High Vacuum (HV) is to be maintained, at least temporarily.

FIG. 3 shows very schematically an example thereof, by means of a bolt B. Many more bolts, other than the one shown in FIG. 3, may be used for constructing a compartment CPT in which a high vacuum is to be maintained, at least temporarily.

Outgassing measurement techniques, especially using the so-called "throughput" method as described in R M Zabel Rev Sci Instrum., 4, p233, have shown that the outgassing of a compartment CPT defined by a metal surface S that includes a subsurface that includes a first zone Z1 and a second zone Z2, as described above, are very comparable to the outgassing of a compartment defined by stainless steel surfaces.

Although the examples have largely dealt with lithographic apparatus, the invention is by no means limited to such apparatus.

Although the examples have largely focused on a second zone Z2 that includes chromium, such a zone may also be formed by indiffusion of, for example, borium via an indiffusion process well-documented in publicly available literature and similar to the process described above.

While specific embodiments of the invention have been described above, it will be appreciated that the invention may be practiced otherwise than as described. The description is not intended to limit the invention.

What is claimed is:

1. An apparatus comprising a compartment for containing a high vacuum environment, the compartment being at least partly defined by a surface having a subsurface, the subsurface comprising a first zone and a second zone, wherein the second zone is located between the first zone and the surface, wherein the first zone comprises a metal or alloy having a composition which differs from stainless steel, and wherein the second zone is constructed and arranged to provide a diffusion barrier so that gaseous molecules are inhibited from escaping from the subsurface into the high vacuum environment.

2. An apparatus according to claim 1, wherein the subsurface comprises an iron-based metal.

3. An apparatus according to claim 2, wherein the subsurface comprises a carbon steel.

4. An apparatus according to claim 3, wherein the subsurface comprises a low alloy steel.

5. An apparatus according to claim 1, wherein the second zone comprises a higher percentage of chromium than a percentage of chromium in the first zone.

6. An apparatus according to claim 1, wherein the second zone comprises a higher percentage of carbon than a percentage of chromium in the first zone.

7. An apparatus according to claim 1, wherein the second zone comprises chromium in a mass percentage of 12% or more.

8. An apparatus according to claim 7, wherein the second zone comprises chromium in a mass percentage of 30% or more.

9. An apparatus according to claim 1, wherein the surface has a hardness of about 2000 Micro Vickers.

10. An apparatus according to claim 1, wherein the second zone has a dimension in a range of about 5 microns to about 25 microns in a direction substantially normal to the surface.

11. An apparatus according to claim 1, wherein the subsurface is created by diffusion of chromium into the surface of a metal layer.

12. An apparatus according to claim 1, wherein the subsurface is obtainable by at least diffusion of carbon into the surface of a metal layer.

13. An apparatus according to claim 1, wherein the apparatus comprises a lithographic apparatus, further comprising:
 an illumination system for providing a beam of radiation;
 a support structure for supporting a patterning device, the patterning device serving to impart the beam of radiation with a pattern in its cross-section;
 a substrate table for holding a substrate; and
 a projection system for projecting the patterned beam onto a target portion of the substrate.

* * * * *